United States Patent
Hashemi et al.

(10) Patent No.: US 9,768,272 B2
(45) Date of Patent: Sep. 19, 2017

(54) REPLACEMENT GATE FINFET PROCESS USING A SIT PROCESS TO DEFINE SOURCE/DRAIN REGIONS, GATE SPACERS AND A GATE CAVITY

(71) Applicant: International Business Machines Corporation, Armonk, NY (US)

(72) Inventors: Pouya Hashemi, White Plains, NY (US); Hong He, Schenectady, NY (US); Alexander Reznicek, Troy, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/870,936

(22) Filed: Sep. 30, 2015

(65) Prior Publication Data
US 2017/0092735 A1    Mar. 30, 2017

(51) Int. Cl.
*H01L 27/12* (2006.01)
*H01L 29/66* (2006.01)
*H01L 21/306* (2006.01)
*H01L 21/308* (2006.01)
*H01L 29/78* (2006.01)
*H01L 29/06* (2006.01)

(52) U.S. Cl.
CPC ...... *H01L 29/6656* (2013.01); *H01L 21/3081* (2013.01); *H01L 21/30604* (2013.01); *H01L 29/0642* (2013.01); *H01L 29/6653* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 6,566,759 B1 | 5/2003 | Conrad et al. | |
| 6,987,289 B2 | 1/2006 | Nowak | |
| 7,923,337 B2 | 4/2011 | Chang et al. | |
| 8,313,999 B2 | 11/2012 | Cappellani et al. | |
| 8,373,239 B2 | 2/2013 | Siddiqui et al. | |
| 8,436,404 B2 | 5/2013 | Bohr et al. | |
| 8,492,228 B1 * | 7/2013 | Leobandung | H01L 21/823443 257/308 |
| 8,524,592 B1 | 9/2013 | Xie et al. | |
| 8,637,359 B2 | 1/2014 | Chang et al. | |
| 8,652,932 B2 | 2/2014 | Adam et al. | |
| 2008/0176406 A1 * | 7/2008 | Ikeda | H01L 21/0337 438/703 |
| 2016/0343706 A1 * | 11/2016 | Chang | H01L 27/0886 |

* cited by examiner

*Primary Examiner* — Sitaramarao S Yechuri
(74) *Attorney, Agent, or Firm* — Scully, Scott, Murphy & Presser, P.C.; Daniel P. Morris, Esq.

(57) ABSTRACT

A replacement gate FinFET manufacturing process in which the source/drain regions, gate structure and gate spacer are all defined by utilizing a single sidewall image transfer technique is provided. In the present application, the source/drain region (i.e., area) are defined by a mandrel structure, while the area for the functional gate structure are defined by the distance between spacers that are located on a pair of neighboring mandrel structures. The gate spacer is defined by the spacer present on the mandrel structures. In some embodiments, semiconductor fin erosion due to gate and gate spacer formation can be reduced or even eliminated.

14 Claims, 8 Drawing Sheets

REPLACEMENT GATE FINFET PROCESS USING A SIT PROCESS TO DEFINE SOURCE/DRAIN REGIONS, GATE SPACERS AND A GATE CAVITY

BACKGROUND

The present application relates to semiconductor technology, and more particularly to a replacement gate FinFET manufacturing process in which the source/drain regions, gate structure and gate spacer are all defined by utilizing a single sidewall image transfer technique. The present application also provides a semiconductor structure, i.e., replacement gate FinFET structure, that is provided by the method of the present application.

For more than three decades, the continued miniaturization of metal oxide semiconductor field effect transistors (MOSFETs) has driven the worldwide semiconductor industry. Various showstoppers to continue scaling have been predicated for decades, but a history of innovation has sustained Moore's Law in spite of many challenges. However, there are growing signs today that MOSFETs are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs), is the next step in the evolution of complementary metal oxide semiconductor (CMOS) devices. Semiconductor FinFETs can achieve higher drive currents with increasingly smaller dimensions as compared to conventional planar FETs.

In prior art replacement gate FinFET manufacturing processes, the integration process typically includes (1) forming a semiconductor fin, (2) forming a sacrificial gate structure, (3) forming a spacer, (4) forming source/drain regions, (5) replacing the sacrificial gate structure with a permanent, i.e., functional, gate structure, and (6) forming self-aligned contacts to the source/drain regions.

Such prior art replacement gate FinFET manufacturing processes are complicated and gate critical dimension variation and contact to gate overlay error may reduce the space for the contact area. Furthermore, the sacrificial gate and spacer etching steps add more process implications of semiconductor fin erosion and damage which, in turn, may cause problems in forming epitaxially merged source/drain structures. Additionally, the spacer etch may result in insufficient spacer removal between the semiconductor fins, which may cause semiconductor fin epitaxy merge concerns. Furthermore, the spacer etch may expose the top corners of the sacrificial gate structure which may result in nodules being formed during the formation of merged epitaxial source/drain regions.

There is thus a need for providing a new replacement gate FinFET manufacturing process that overcomes or at least suppresses the problems mentioned above with prior art replacement gate FinFET manufacturing processes.

SUMMARY

A replacement gate FinFET manufacturing process in which the source/drain regions, gate structure and gate spacer are all defined by utilizing a single sidewall image transfer technique is provided. In the present application, the source/drain region (i.e., area) is defined by a mandrel structure, while the area for the functional gate structure is defined by the distance between spacers that are located on a pair of neighboring mandrel structures. The gate spacer is defined by the spacer present on the mandrel structures. In some embodiments, semiconductor fin erosion due to gate and gate spacer formation can be reduced or even eliminated. In other embodiments, the method of the present application results in less defects being formed during the formation of epitaxial source/drain regions. In yet other embodiments, the method of the present application can suppress or even eliminate non-selective epitaxy nodules at the gate corners.

In one aspect of the present application, a method of forming a semiconductor structure is provided. In one embodiment of the present application, the method may include forming a pair of spaced apart mandrel structures on a surface of an upper hard mask layer, the upper hard mask layer is located on a lower hard mask layer that is located above and surrounding a portion of a semiconductor fin, wherein a spacer is present on each sidewall surface of each mandrel structure. Next, the upper and lower hard mask layers are etched utilizing each mandrel structure and the spacers an etch mask. Each mandrel structure is then removed to provide a pair of source/drain openings. A length of each source/drain opening is then extended by etching through remaining portions of the upper hard mask layer and the lower hard mask layer to provide a pair of spaced apart upper hard mask spacer portions and a pair of lower hard mask spacer portions and to provide an extended length source/drain opening that exposes a surface of the semiconductor fin. Next, a doped epitaxial semiconductor material is formed on the semiconductor fin and within each extended length source/drain opening. A flowable dielectric material structure is then formed in a lower portion of each extended length source/drain opening and atop the epitaxial doped semiconductor material, the flowable dielectric material structure having a topmost surface that is coplanar with a topmost surface of each lower hard mask spacer portion. Next, a functional gate structure is formed contacting a sidewall surface of each lower hard mask spacer portion.

In another aspect of the present application, a semiconductor structure is provided. In one embodiment of the present application, the semiconductor structure may include a functional gate structure straddling over a portion of a semiconductor fin. A gate spacer is located on each vertical sidewall surface of the functional gate structure. An epitaxial doped semiconductor material is located on other portions of the semiconductor fin and both sides of the functional gate structure. A flowable dielectric material structure is located on the epitaxial doped semiconductor material and having a first sidewall surface contacting a sidewall surface of the gate spacer. In accordance with the present application, sidewall surfaces of the flowable dielectric material structure are vertically coincident to sidewall surfaces of the epitaxial doped semiconductor material. The structure further includes an outer spacer contacting a second sidewall surface of the flowable dielectric material structure, wherein the second sidewall surface is opposite the first sidewall surface.

DETAILED DESCRIPTION

Figure 1:
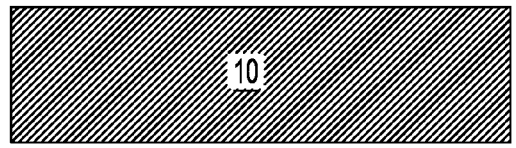
FIG. 1 is a cross sectional view of an exemplary semiconductor structure comprising a semiconductor substrate that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure comprising a semiconductor substrate 10 that can be employed in accordance with an embodiment of the present application.

In some embodiments of the present application, the semiconductor substrate 10 can be a bulk semiconductor substrate. The term "bulk semiconductor substrate" denotes a substrate that is entirely composed of at least one semiconductor material. When a bulk semiconductor substrate is employed as semiconductor substrate 10, the bulk semiconductor substrate can be comprised of, for example, Si, Ge, SiGe, SiC, SiGeC, II-IV compound semiconductors, and III-V compound semiconductors such as, for example, InAs, GaAs, and InP. Multilayers of these semiconductor materials can also be used as the semiconductor material of the bulk semiconductor. In one embodiment, the semiconductor substrate 10 can be comprised of a single crystalline semiconductor material, such as, for example, single crystalline silicon.

In another embodiment, a semiconductor-on-insulator (SOI) substrate (not specifically shown) can be employed as the semiconductor substrate 10. Although not specifically shown, one skilled in the art understands that an SOI substrate includes a handle substrate, an insulator layer located on an upper surface of the handle substrate, and a semiconductor layer located on an uppermost surface of the insulator layer. The handle substrate provides mechanical support for the insulator layer and the semiconductor layer.

The handle substrate and the semiconductor layer of the SOI substrate may comprise the same, or different, semiconductor material. The semiconductor material of the handle substrate and/or semiconductor layer of the SOI substrate may include one of the semiconductor materials mentioned above for the bulk semiconductor substrate. In one embodiment, the handle substrate and the semiconductor layer are both comprised of silicon. In some embodiments, the handle substrate is a non-semiconductor material including, for example, a dielectric material and/or a conductive material. In yet other embodiments, the handle substrate can be omitted and a substrate including an insulator layer and a semiconductor layer can be used as semiconductor substrate 10.

In some embodiments, the handle substrate and the semiconductor layer may have the same or different crystal orientation. For example, the crystal orientation of the handle substrate and/or the semiconductor layer may be {100}, {110}, or {111}. Other crystallographic orientations besides those specifically mentioned can also be used in the present application. The handle substrate and/or the semiconductor layer of the SOI substrate may be a single crystalline semiconductor material, a polycrystalline material, or an amorphous material. Typically, at least the semiconductor layer is a single crystalline semiconductor material. In some embodiments, the semiconductor layer that is located atop the buried insulator layer can be processed to include semiconductor regions having different crystal orientations.

The insulator layer of the SOI substrate may be a crystalline or non-crystalline oxide or nitride. In one embodiment, the insulator layer is an oxide such as, for example, silicon dioxide In another embodiment, the insulator layer is a nitride such as, for example, silicon nitride or boron nitride. In yet other embodiments, the insulator layer is a multilayered stack of, in any order, silicon dioxide and boron nitride.

When a SOI substrate is employed as the semiconductor substrate 10 shown in FIG. 1, the SOI substrate may be formed utilizing standard processes including for example, SIMOX (Separation by IMplantation of OXygen) or layer transfer. When a layer transfer process is employed, an optional thinning step may follow the bonding of two semiconductor wafers together. The optional thinning step reduces the thickness of the semiconductor layer to a layer having a thickness that is more desirable.

In one example, the thickness of the semiconductor layer of the SOI substrate can be from 10 nm to 150 nm. In another example, the thickness of the semiconductor layer of the SOI substrate can be from 50 nm to 70 nm. Other thicknesses that are lesser than, or greater than, the aforementioned thickness range can also be employed as the thickness for the semiconductor layer. The insulator layer of the SOI substrate may have a thickness from 1 nm to 200 nm. Other thicknesses that are lesser than, or greater than, the aforementioned thickness range can also be employed as the thickness for the insulator layer. The thickness of the handle substrate of the SOI substrate is inconsequential to the present application.

Figure 2:
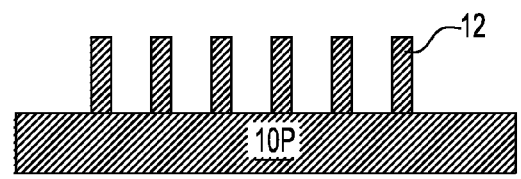
FIG. 2 is a cross sectional view of the exemplary semiconductor structure of FIG. 1 after forming semiconductor fins within an upper semiconductor material portion of the semiconductor substrate.

Referring now to FIG. 2, there is illustrated the exemplary semiconductor structure of FIG. 1 after forming semiconductor fins 12 within an upper semiconductor material portion of the semiconductor substrate 10. Although the present application describes and illustrates the formation of a plurality of semiconductor fins 12, the present application can be employed when a single semiconductor fin 12 is formed.

Each semiconductor fin 12 that is formed extends upwards from a surface of a remaining portion of the semiconductor substrate 10. The remaining portion of the semiconductor substrate 10 can be referred to herein as substrate portion 10P. In some embodiments and when a bulk semiconductor substrate is employed, the substrate portion 10P comprises a semiconductor material which can be the same as, or different from, the semiconductor fins 12. In other embodiments, and when a SOI substrate is formed, the semiconductor fins 12 are formed within the semiconductor layer of the SOI substrate and the substrate portion 10P comprises at least the insulator layer and, if present, the handle substrate. In such an embodiment, each semiconductor fin 12 extends upward from the insulator layer.

Each semiconductor fin 12 that is formed includes a pair of vertical sidewalls that are parallel to each other. As used herein, a surface is "vertical" if there exists a vertical plane from which the surface does not deviate by more than three times the root mean square roughness of the surface. In one embodiment of the present application, each semiconductor fin 12 that is formed has a height from 10 nm to 150 nm, and a width from 5 nm to 30 nm. Other heights and widths that are lesser than, or greater than, the aforementioned ranges may also be used in the present application for each semiconductor fin 12. When multiple semiconductor fins are present in a given area of the structure, each semiconductor fin 12 is separated from its nearest neighboring semiconductor fin 12 by a pitch that is from 20 nm to 60 nm; the pitch can be measured from a central portion of one semiconductor fin to a central portion of the nearest neighboring semiconductor fin. Each semiconductor fin 12 includes one of the semiconductor materials mentioned above for the bulk semiconductor substrate or the semiconductor material layer of the SOI substrate.

Each semiconductor fin 12 can be formed by patterning the upper semiconductor material portion of the semiconductor substrate 10 shown in FIG. 1. In one embodiment, the patterning process used to form each semiconductor fin 12 may include lithography and etching. Lithography includes forming a photoresist material (not shown) atop a material or material stack to be patterned; in the present application the photoresist material is formed atop the topmost semiconductor material of the semiconductor substrate 10. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the semiconductor substrate 10. The pattern provided by the patterned photoresist structures is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used.

In another embodiment, the patterning process may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous carbon, amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may include, for example, silicon dioxide, silicon nitride, titanium nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

Figure 3:
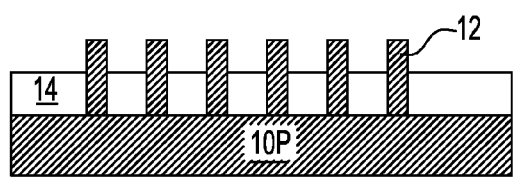
FIG. 3 is a cross sectional view of the exemplary semiconductor structure of FIG. 2 after forming a local isolation structure in between each semiconductor fin.

Referring now to FIG. 3, there is illustrated the exemplary semiconductor structure of FIG. 2 after forming a local isolation structure 14 in between, i.e., at a footprint of, each semiconductor fin 12. Notably, the local isolation structure 14 is formed in a gap that is located between each semiconductor fin 12. The local isolation structure 14 has a topmost surface that is located beneath a topmost surface of each semiconductor fin 12. Thus, portions of each semiconductor fin 12 are bare after local isolation structure 14 formation. As is shown, a sidewall surface of each local isolation structure 14 directly contacts a lower portion of the sidewall surface of one of the semiconductor fins 12 and a bottommost surface of each local isolation structure 14 directly contacts a topmost surface of the substrate portion 10P.

Each local isolation structure 14 can be formed by deposition of a trench dielectric material such as, a trench dielectric oxide, and thereafter a recess etch may be used to provide the local isolation structure 14. In some embodiments and when the semiconductor fin 12 has a bottommost surface that directly contacts an insulator layer of, for example, an SOI substrate, the formation of the local isolation structure 14 can be omitted.

Figure 4:
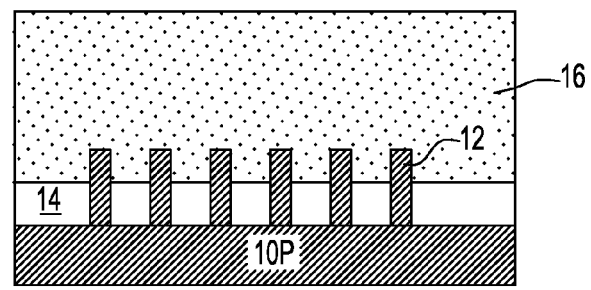
FIG. 4 is a cross sectional view of the exemplary semiconductor structure of FIG. 3 after forming a lower hard mask layer atop each local isolation structure and surrounding exposed portions of each semiconductor fin.

Referring now to FIG. 4, there is illustrated the exemplary semiconductor structure of FIG. 3 after forming a lower hard mask layer 16 atop each local isolation structure 14 and surrounding exposed portions of each semiconductor fin 12. The lower hard mask layer 16 may comprise any hard mask material such as, for example, silicon dioxide, silicon nitride, and/or silicon oxynitride. The lower hard mask layer 16 typically is composed of a hard mask material that has a different etch rate than the trench dielectric material that can provide the local isolation structures 14. In one example, and when each local isolation structure 14 comprises a trench dielectric oxide, then the lower hard mask layer 16 can be composed of silicon nitride.

The hard mask material that provides the lower hard mask layer 16 can be formed utilizing a conventional deposition process such as, for example, chemical vapor deposition or plasma enhanced chemical vapor deposition. The hard mask material that provides the lower hard mask layer 16 can have a thickness from 20 nm to 100 nm. Other thicknesses that are lesser than, or greater than, the aforementioned thickness range can also be employed as the thickness of the hard mask material that provides the lower hard mask layer 16 so long as the lower hard mask layer 16 covers the entirety of the exposed portions of each semiconductor fin 12.

Figure 5A:
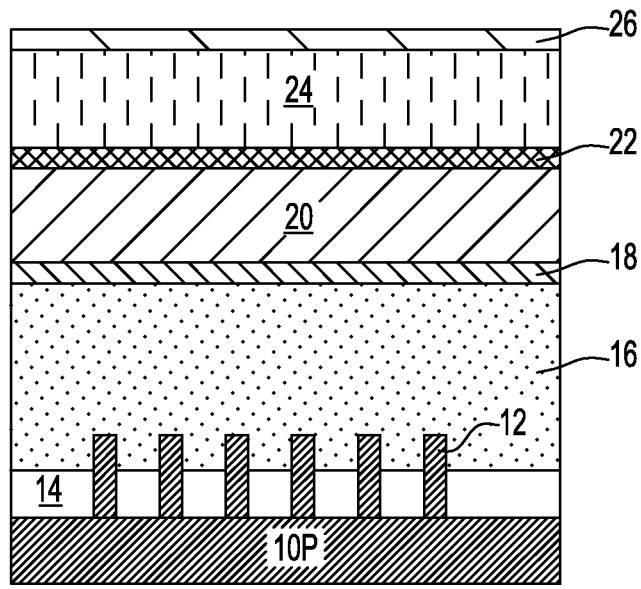
FIG. 5A is a cross sectional view perpendicular to the semiconductor fins of the exemplary semiconductor structure of FIG. 4 after forming a material stack comprising, from bottom to top, an upper hard mask layer, a layer of mandrel material, a layer of hard mask material, an optical planarization layer, an anti-reflective coating (ARC) and a pair of spaced apart patterned photoresist structures.
Figure 5B:
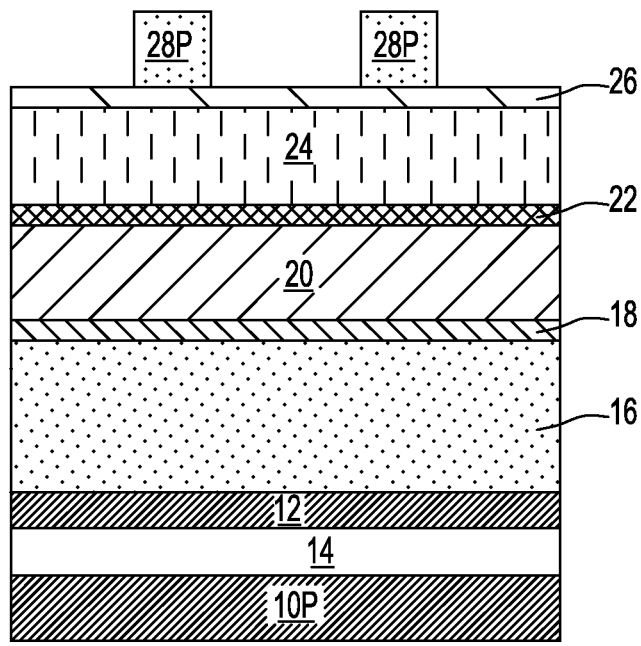
FIG. 5B is a cross sectional view parallel to the semiconductor fins of the exemplary semiconductor structure of FIG. 4 after forming a material stack comprising, from bottom to top, an upper hard mask layer, a layer of mandrel material, an optical planarization layer, an anti-reflective coating (ARC) and a pair of patterned photoresist structures.

Referring now to FIGS. 5A-5B, there are shown different cross sectional views of the exemplary semiconductor structure of FIG. 4 after forming a material stack comprising, from bottom to top, an upper hard mask layer 18, a layer of mandrel material 20, a layer of hard mask material 22, an optical planarization layer 24, an anti-reflective coating (ARC) 26 and a pair of spaced apart patterned photoresist structures 28P. The layer of hard mask material 22, the optical planarization layer 24, the anti-reflective coating (ARC) 26 and the patterned photoresist structures 28P are employed in the present application as one masking scheme that can be employed in patterning the layer of mandrel material 20. Other masking schemes can also be used in the present application.

The upper hard mask layer 18 may be selected from one of the hard mask materials mentioned above for the lower hard mask layer 16 with the proviso that the hard mask material that provides the upper hard mask layer 18 has a different etch rate than the underlying hard mask material that provides the lower hard mask layer 16. In one example, and when the lower hard mask layer 16 comprises silicon nitride, then the upper hard mask layer 18 may comprise silicon dioxide. The hard mask material that provides the upper hard mask layer 18 can be formed utilizing a conventional deposition process such as, for example, chemical vapor deposition or plasma enhanced chemical vapor deposition. The hard mask material that provides the upper hard mask layer 18 can have a thickness from 5 nm to 20 nm. Other thicknesses that are lesser than, or greater than, the aforementioned thickness range can also be employed as the thickness of the hard mask material that provides the upper hard mask layer 18.

The layer of mandrel material 20 may comprise one of the mandrel materials mentioned above for the SIT process. The layer of mandrel material 20 can be formed by a deposition process such as, for example, chemical vapor deposition or plasma enhanced chemical vapor deposition. The layer of mandrel material 20 can have a thickness from 20 nm to 75 nm. Other thickness that are lesser than or greater than the aforementioned thickness range may also be employed as the thickness of the layer of mandrel material 20.

The layer of hard mask material 22 may include any of the hard mask materials mentioned above for the lower hard mask layer 16. In one example, the layer of hard mask material 22 may include silicon nitride. The layer of hard mask material 22 can be formed by a deposition process such as, for example, chemical vapor deposition or plasma enhanced chemical vapor deposition. The layer of hard mask material 22 can have a thickness from 5 nm to 20 nm. Other thicknesses that are lesser than, or greater than, the aforementioned thickness range can also be employed as the thickness of the hard mask material that provides layer of hard mask material 22.

The optical planarization layer (OPL) 24 may comprise a self-planarizing material. In one example, the OPL 24 can be an organic material including C, O, and H, and optionally including Si and/or F. In another example, the OPL 24 can be amorphous carbon. The self-planarizating material that can provide the OPL 24 can be formed by spin-on coating, chemical vapor deposition, plasma enhanced chemical vapor deposition, evaporation or chemical solution deposition. The thickness of the OPL 24 can be from 10 nm to 300 nm, although lesser and greater thicknesses can also be employed.

The anti-reflective coating (ARC) 26 comprises any anti-reflective coating material that can reduce image distortions associated with reflections off the surface of underlying structure. In one example, the ARC 26 comprises a silicon (Si)-containing antireflective coating material. The antireflective coating material that provides the ARC 26 can be formed by spin-on coating, chemical vapor deposition, plasma enhanced chemical vapor deposition, evaporation or chemical solution deposition. The thickness of the ARC 26 can be from 10 nm to 150 nm, although lesser and greater thicknesses can also be employed.

Next, a photoresist material is formed on the ARC 26 and the photoresist material is then patterned by lithography to provide the patterned photoresist structures 28P. As is shown, at least one pair of spaced apart patterned photoresist structures 28P is provided. The photoresist material that may be employed in the present application may comprise a positive-tone photoresist, a negative tone-resist or a hybrid photoresist material. The photoresist material may be deposited utilizing one of the deposition processes mentioned above in providing the antireflective coating material.

Figure 6A:
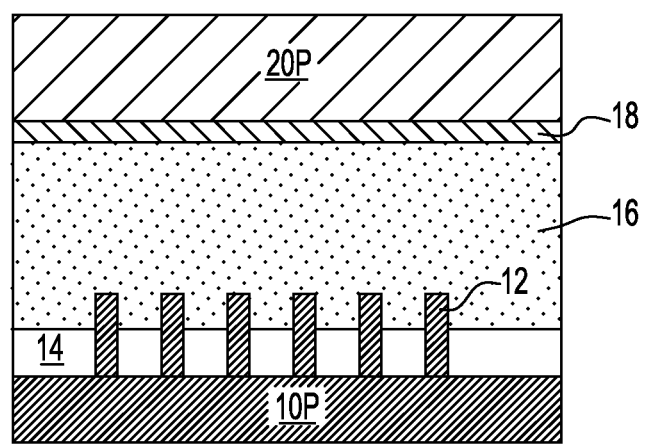
FIG. 6A is a cross sectional view of the exemplary semiconductor structure of FIG. 5A after forming at least one pair of spaced apart mandrel structures within the layer of mandrel material.
Figure 6B:
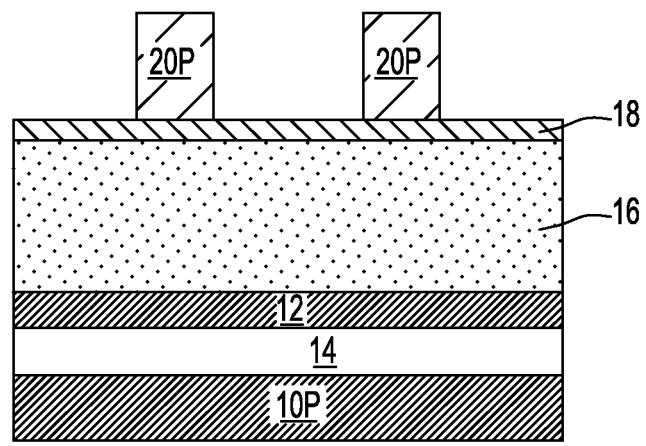
FIG. 6B is a cross sectional view of the exemplary semiconductor structure of FIG. 5B after forming at least one pair of spaced apart mandrel structures within the layer of mandrel material.

Referring now to FIGS. 6A-6B, there are illustrated various views of the exemplary semiconductor structure of FIGS. 5A-5B after forming at least one pair of spaced apart mandrel structures 20P within the layer of mandrel material 20. The at least one pair of spaced apart mandrel structures 20P comprises at least one pattern transfer etch process that can etch entirely through the ARC 26, OPL 24, layer of hard mask 22 and the layer of mandrel material 20 utilizing each patterned photoresist structure 28P as an etch mask. The pattern transfer etch may comprise a single anisotropic etching process or multiple anisotropic etching processing can be used. The pattern transfer etch may include a dry etch (such as, for example, reactive ion etching or plasma etching) and/or a chemical wet etch. The one pattern transfer etch process stops on a surface of the upper hard mask layer 18.

Each mandrel structure 20P comprises a remaining portion of the layer of mandrel material 20. Each mandrel structure 20P defines the width of a source/drain region to be subsequently formed. In one embodiment of the present application, each mandrel structure 20P has a width from 15 nm to 40 nm. Other widths that are lesser than, or greater than, the aforementioned width ranges may also be used as the width of each mandrel structure 20P.

The patterned photoresist structure 28P, and the remaining portions of ARC 26, OPL 24, layer of hard mask 22 can be removed any time after initially performing the pattern transfer etching process utilizing processes such as, for example, resist stripping and/or chemical mechanical polishing, that are well known to those skilled in the art.

Figure 7A:
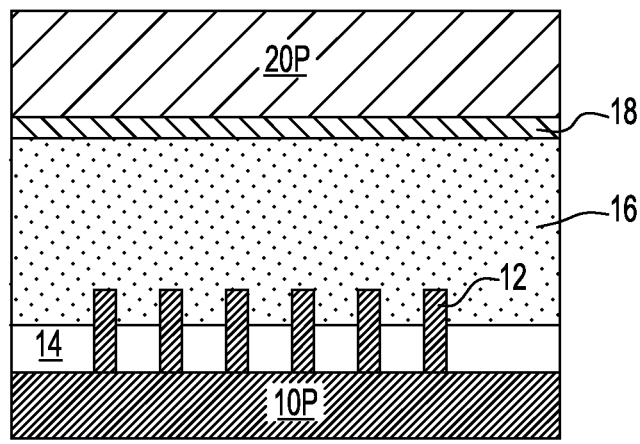
FIG. 7A is a cross sectional view of the exemplary semiconductor structure of FIG. 6A after forming a spacer on exposed sidewalls of each mandrel structure.
Figure 7B:
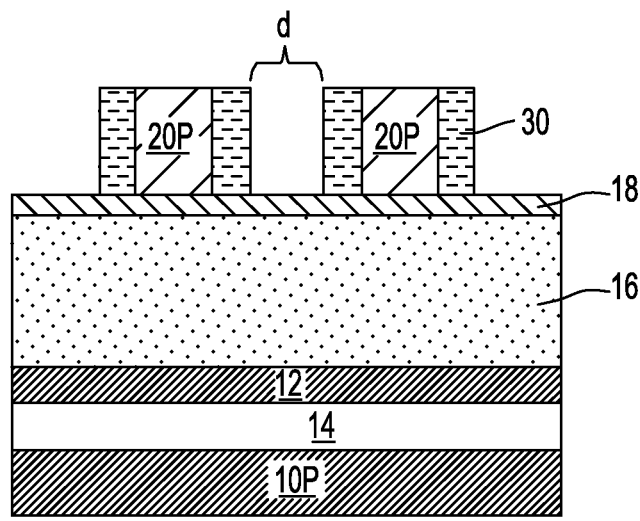
FIG. 7B is a cross sectional view of the exemplary semiconductor structure of FIG. 6B after forming a spacer on exposed sidewalls of each mandrel structure.

Referring now to FIGS. 7A-7B, there are shown various views of the exemplary semiconductor structure of FIGS. 6A-6B after forming a spacer 30 on exposed sidewalls of each mandrel structure 20P. Each spacer 30 may include one of the spacer materials mentioned above for the spacers used in the SIT process provided that the spacer material that provides each spacer 30 has a different etch rate than the mandrel material that provides each mandrel structure 20P. In one example, each spacer 30 comprise titanium nitride. Each spacer 30 can be formed utilizing the technique mentioned above in forming the spacers in the SIT process used to define the semiconductor fins 12. That is, each spacer 30 can be formed by deposition of a spacer material and then subjecting the spacer material to etching. Spacers 30 that are located between each pair of mandrel structures and that face each other will be used in the present application in defining a gate spacer (to be subsequently formed). The distance, d, between such spacers is used in the present application in defining the width of a subsequently formed functional gate structure.

Figure 8A:
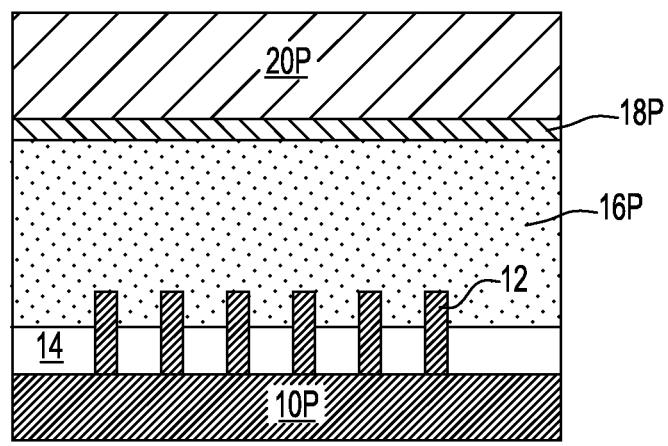
FIG. 8A is a cross sectional view of the exemplary semiconductor structure of FIG. 7A after etching the upper and lower hard mask layers utilizing each mandrel structure and each spacer as an etch mask.
Figure 8B:
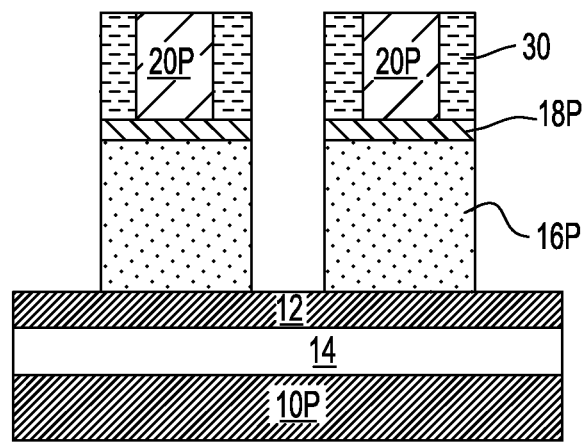
FIG. 8B is a cross sectional view of the exemplary semiconductor structure of FIG. 7B after etching the upper and lower hard mask layers utilizing each mandrel structure and each spacer as an etch mask.

Referring now to FIGS. 8A-8B, there are illustrated various views of the exemplary semiconductor structure of FIGS. 7A-7B after etching the upper and lower hard mask layers (18, 16) utilizing each mandrel structure 20P and each spacer 30 as an etch mask. The etching stops on a surface of the local isolation structure 14. The etching used in this step of the present application may include one or more anisotropic etching processes. In one embodiment, the one or more anisotropic etching processes includes at least one reactive ion etch. After etching, a portion of the upper hard mask layer 18 and a portion of the lower hard mask layer 16 that are located directly beneath each etch mask remain. The remaining portions of the upper hard mask layer 18 can be referred to as upper hard mask portion 18P, while the remaining portions of the lower hard mask layer 16 can be referred to as a lower hard mask portion 16P. Each lower and upper hard mask portion (16P, 18P) has sidewall surfaces that are vertically coincident to sidewall surfaces of the overlying spacer 30.

Figure 9:
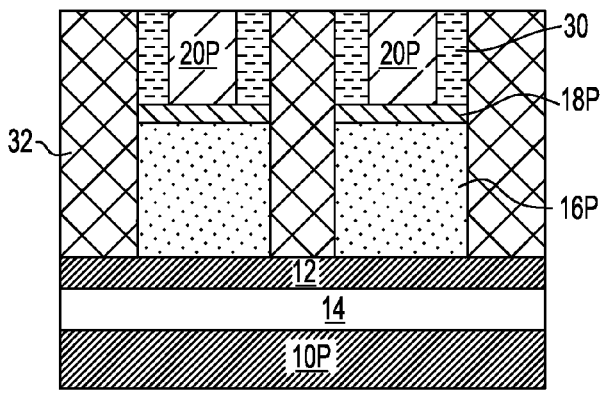
FIG. 9 is a cross sectional view of the exemplary semiconductor structure of FIG. 8B after forming a sacrificial material.

Referring now to FIG. 9, there is illustrated the exemplary semiconductor structure of FIG. 8B after forming a sacrificial material 32. The sacrificial material 32 fills the gaps that are located between the structure including the lower hard mask portion 16P, the upper hard mask portion 18P, the mandrel structure 20P and spacers 30. The sacrificial material 32 has a topmost surface that is coplanar with a topmost surface of the spacers 30 and the mandrel structures 20P.

In one embodiment of the present application, the sacrificial material 32 may be a layer of doped or undoped amorphous silicon. In another embodiment of the present application, the sacrificial material 32 may be a layer of doped or undoped polysilicon. When the sacrificial material 32 is a doped material, the dopant can be an element from Group III or V of the Periodic Table of Elements. In one example, As is used as the dopant species. In some embodiments, the dopant species can be introduced during the deposition process used to provide sacrificial material 32. In other embodiments, the dopant species can be introduced into an intrinsic sacrificial material 32 by utilizing one of ion implantation or gas phase doping.

The sacrificial material 32 can be formed utilizing a deposition process such as, for example, chemical vapor deposition, plasma enhanced chemical vapor deposition or physical vapor deposition. In some embodiments of the present application, an etch back or planarization process may follow the deposition of the material that provides the sacrificial material 32.

Figure 10:
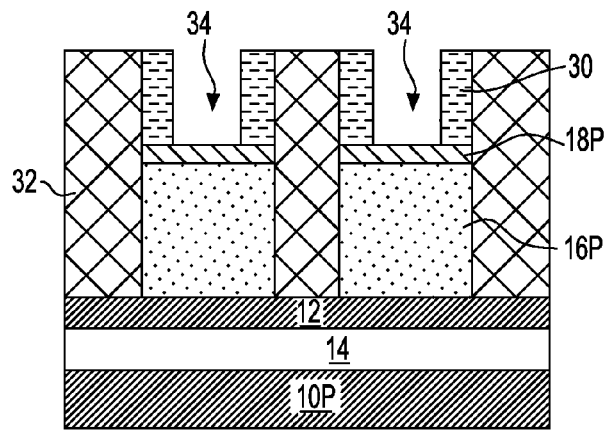
FIG. 10 is a cross sectional view of the exemplary semiconductor structure of FIG. 9 after removing each mandrel structure to provide source/drain openings.

Referring now to FIG. 10, there is illustrated the exemplary semiconductor structure of FIG. 9 after removing each mandrel structure 20P to provide source/drain openings 34. Each mandrel structure 20P can be removed utilizing an etching process that selectively removes the material that provides the mandrel structures 20P relative to the sacrificial material 32, spacers 30, and the material that provides the upper hard mask portions 18P. In one example, and when each mandrel structure 20P comprises amorphous carbon, ashing can be used to selectively remove each mandrel structure 20P. Source/drain openings 34 expose a surface of the underlying upper hard mask portion 18P.

Figure 11:
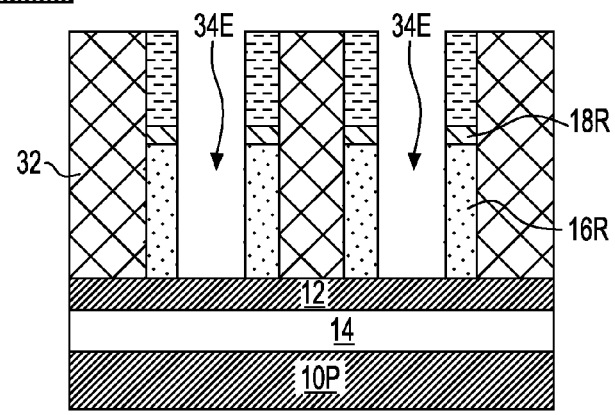
FIG. 11 is a cross sectional view of the exemplary semiconductor structure of FIG. 10 after extending the length of each source/drain opening.

Referring now to FIG. 11, there is illustrated the exemplary semiconductor structure of FIG. 10 after extending the length of each source/drain opening 34. Each extended length source/drain opening is labeled as 34E in the drawings of the present application. Each extended length source/drain opening 34E exposes a surface of the semiconductor fin 12 in which a source region or a drain region is to be formed. Each extended length source/drain opening 34E can be formed utilizing one or more one or more anisotropic etching processes. In one embodiment, the one or more anisotropic etching processes includes at least one reactive ion etch. After etching, a portion of the upper hard mask portion 18P and a portion of the lower hard mask portion 16P that are located directly beneath each spacer 30 remain. The remaining portions of the upper hard mask portion 18P can be referred to as upper hard mask spacer portion 18R, while the remaining portions of the lower hard mask portion 16P can be referred to as a lower hard mask spacer portion 16R. As is shown, a pair of spaced apart upper hard mask spacer portions 18R and a pair of spaced apart lower hard mask spacer portions 16R are formed. Each lower and upper hard mask spacer portion (16R, 18R) has sidewall surfaces that are vertically coincident to sidewall surfaces of the overlying spacer 30.

Figure 12:
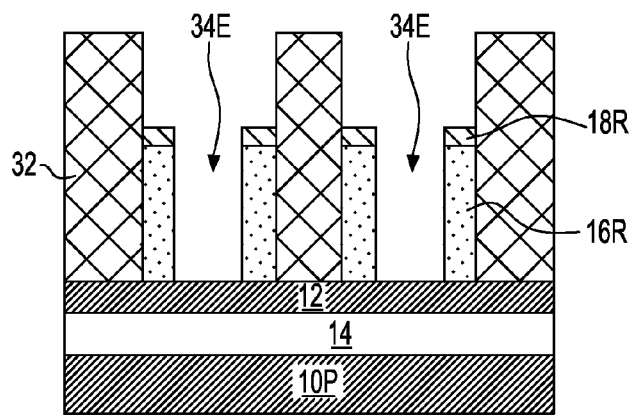
FIG. 12 is a cross sectional view of the exemplary semiconductor structure of FIG. 11 after removing each spacer.

Referring now to FIG. 12, there is illustrated the exemplary semiconductor structure of FIG. 11 after removing each spacer 30. Each spacer 30 can be removed utilizing an etching process that selectively removes the material of the spacers 30. In one example, and when spacers 30 comprise TiN, a mixture of ammonium hydroxide, hydrogen peroxide and deionized water can be used to remove the spacers 30.

Figure 13:
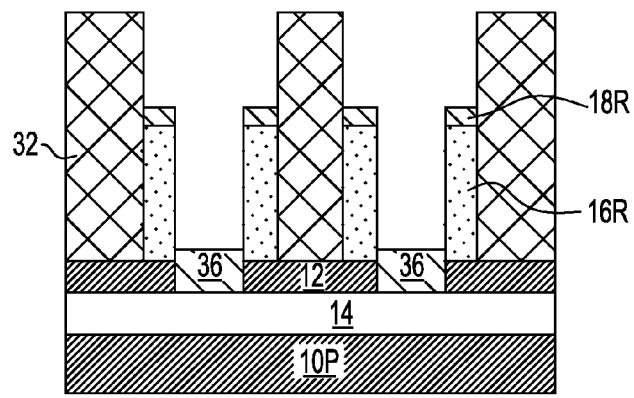
FIG. 13 is a cross sectional view of the exemplary semiconductor of FIG. 12 after forming an epitaxial doped semiconductor material within each extended source/drain opening.

Referring now to FIG. 13, there is illustrated the exemplary semiconductor of FIG. 12 after forming an epitaxial doped semiconductor material 36 within each extended source/drain opening 34E. The epitaxial doped semiconductor material 36 can be formed by an epitaxial growth (or deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In the present application, the epitaxial doped semiconductor material 36 has an epitaxial relationship with the semiconductor fin 12.

Examples of various epitaxial growth process apparatuses that are suitable for use in forming epitaxial doped semiconductor material 36 of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

The epitaxial doped semiconductor material 36 includes a dopant (n-type or p-type) and at least one semiconductor material including any of the semiconductor materials mentioned above for the bulk semiconductor substrate. In one embodiment, the epitaxial doped semiconductor material 36 comprises a same semiconductor material as the semiconductor fins 12. In another embodiment, the epitaxial doped semiconductor material 36 comprises a different semiconductor material than the semiconductor fins 12. When a plurality of semiconductor fins 12 are formed, the epitaxial doped semiconductor material 36 within each extended source/drain opening 34E may merge together.

The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The concentration of dopants within semiconductor material that provides the can be epitaxial doped semiconductor material 36 within ranges typically used in forming metal oxide semiconductor field effect transistors (MOSFETs).

A number of different sources may be used for the deposition of epitaxial doped semiconductor material 36. In some embodiments, the source gas for the deposition of epitaxial doped semiconductor material 36 includes a silicon containing gas source and/or a germanium containing gas source. Examples of silicon gas sources include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium gas sources include germane, digermane, halogermane, dichlorogermane, trichlorogermane, tetrachlorogermane and combinations thereof. In some embodiments, epitaxial doped semiconductor material 36 can be formed from a source gas that includes a compound containing silicon and germanium. Carrier gases like hydrogen, nitrogen, helium and argon can be used.

In some embodiments, the dopant can be introduced into the source gas used to provide the epitaxial doped semiconductor material 36. In other embodiments, the dopant can be introduced into an intrinsic epitaxial semiconductor material utilizing one of gas phase doping or ion implantation.

In one embodiment, epitaxial doped semiconductor material 36 has a thickness from 5 nm to 20 nm. Other thicknesses that are lesser than, or greater than, the aforementioned thickness range may also be employed as the thickness of epitaxial doped semiconductor material 36. As is shown, the epitaxial doped semiconductor material 36 has a topmost surface that is located above a topmost surface of the semiconductor fin 12.

Figure 14:
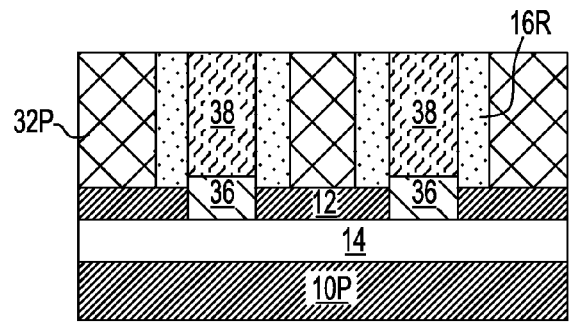
FIG. 14 is a cross sectional view of the exemplary semiconductor structure of FIG. 13 after forming a flowable dielectric material and planarizing to a topmost surface of remaining portions of the lower hard mask layer.

Referring now to FIG. 14, there is illustrated the exemplary semiconductor structure of FIG. 13 after forming a flowable dielectric material and planarizing to a topmost surface of remaining portions of the lower hard mask layer (i.e., lower hard mask spacer portions 16R). The flowable dielectric material that remains after planarization can be referred to as a flowable dielectric material structure 38. The flowable dielectric material that can be used in the present application may be a flowable oxide such as, for example, silicon dioxide.

The flowable dielectric material can be formed utilizing a deposition process such as, for example, chemical vapor deposition or plasma enhanced chemical vapor deposition. Following the deposition process, a planarization process such as, for example, chemical mechanical polishing (CMP), may be used to provide the planar structure shown in FIG. 14. During the planarization process, the spacers 30 and the upper hard mask spacer portions 18R are completely removed, while an upper portion of the flowable dielectric material and an upper portion of the sacrificial material 32 are removed. The portions of the sacrificial material 32 that remains after planarization may be referred to as a sacrificial dielectric portion 32P.

Figure 15:
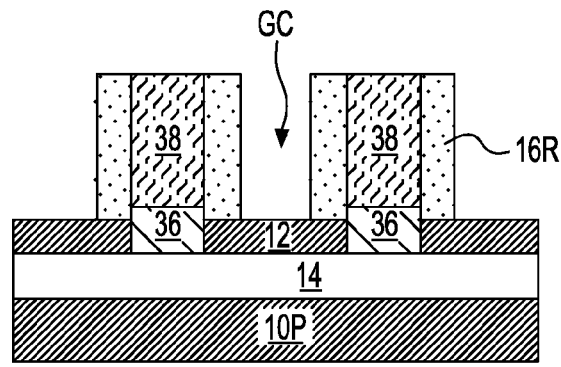
FIG. 15 is a cross sectional view of the exemplary semiconductor structure of FIG. 14 after removing remaining portions of the sacrificial material.

Referring now to FIG. 15, there is illustrated the exemplary semiconductor structure of FIG. 14 after removing remaining portions of the sacrificial material (i.e., sacrificial material portions 32P). The sacrificial material portions 32P can be removed completely from the structure utilizing an etching process that is selective in removing the material of the sacrificial material portions 32P. In one example, and when the sacrificial material portions 32P comprise amorphous silicon, gaseous HCl can be used to completely remove the sacrificial material portions from the structure. It is noted that this step of the present application forms a gate cavity (GC) located between neighboring flowable dielectric material structures 38 that include lower hard mask spacer portions 16R. In accordance with the present application GC is equal to d mentioned above.

Figure 16A:
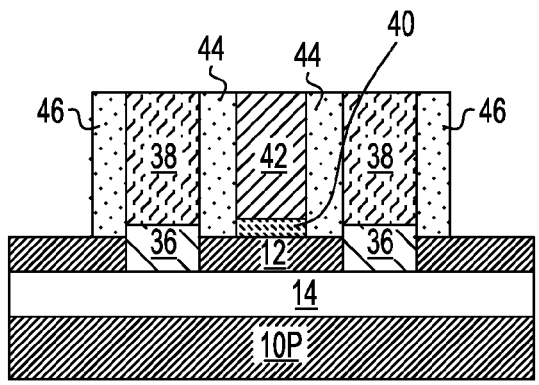
FIG. 16A is a cross view of the exemplary semiconductor structure of FIG. 15 after forming a functional gate structure within a gate cavity and straddling a portion of each semiconductor fin in accordance with one embodiment of the present application.
Figure 16B:
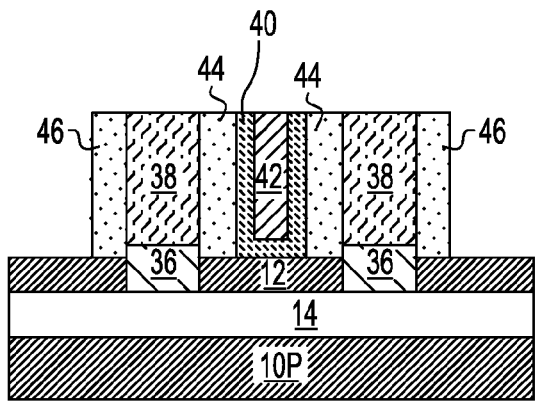
FIG. 16B is a cross view of the exemplary semiconductor structure of FIG. 15 after forming a functional gate structure within a gate cavity and straddling a portion of each semiconductor fin in accordance with another embodiment of the present application.

Referring now to FIG. 16A, there is illustrated the exemplary semiconductor structure of FIG. 15 after forming a functional gate structure (40, 42) within a gate cavity, GC, and straddling a portion of each semiconductor fin 12 in accordance with one embodiment of the present application. FIG. 16B illustrates the exemplary semiconductor structure of FIG. 15 after forming a functional gate structure (40, 42) within a gate cavity, GC, and straddling a portion of each semiconductor fin 12 in accordance with another embodiment of the present application. In the drawings, the lower hard mask spacer portions 16R have been relabeled as either element 44 or element 46. Element 44 represents gate spacers and element 46 represents outer spacers. The gate spacers 44 are present on the sidewall surface of the functional gate structure, while the outer spacers 46 are present on a sidewall surface of the flowable dielectric material structures 38. In the present application, the sidewall surfaces of gate structure (40, 42), the lower hard mask spacer portions (now relabeled as 44 and 46) and the flowable dielectric material structure 38 are vertical sidewall surfaces.

By "functional gate structure" it is meant a permanent gate structure used to control output current (i.e., flow of carriers in the channel) of a semiconducting device through electrical or magnetic fields. Although a single functional gate structure is described and illustrated, a plurality of functional gate structures can be formed straddling over different portions of each semiconductor fin 12.

Each functional gate structure includes a gate material stack of, from bottom to top, a gate dielectric portion 40 and a gate conductor portion 42. In some embodiments (not shown), a gate cap portion can be present atop at least the gate conductor portion 42. FIG. 16A shows an embodiment in which the gate dielectric portion 40 is located entirely beneath a bottommost surface of the gate conductor portion 42. FIG. 16B shows another embodiment in which the gate dielectric portion 40 is U-shaped and the gate conductor portion 42 is located between the vertical wall portions of the U-shaped gate dielectric portion. In such an embodiment, the gate dielectric portion 40 can have a topmost surface that is coplanar with a topmost surface of the gate conductor portion 42.

The gate dielectric portion 40 of the functional gate structure comprises a gate dielectric material. The gate dielectric material that provides the gate dielectric portion 40 can be an oxide, nitride, and/or oxynitride. In one example, the gate dielectric material that provides the gate dielectric portion 40 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric portion 40. In some embodiments, the gate dielectric portion 40 of each functional gate structure comprises a same gate dielectric material. In other embodiments, a first set of functional gate structures comprises a first gate dielectric material while a second set of functional gate structures comprises a second gate dielectric material that differs from the first gate dielectric material.

The gate dielectric material used in providing the gate dielectric portion 40 can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectric portions of different functional gate structures, block mask technology can be used. In one embodiment of the present application, the gate dielectric material used in providing the gate dielectric portion 40 can have a thickness in a range from 1 nm to 10 nm. Other thicknesses that are lesser than, or greater than, the aforementioned thickness range can also be employed for the gate dielectric material.

The gate conductor portion 42 of the functional gate structure comprises a gate conductor material. The gate conductor material used in providing the gate conductor portion 42 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor portion 42 of each functional gate structure comprises a same conductive material. In other embodiments, the gate conductor portion of a first functional gate structure comprises a different gate conductor material than a gate conductor portion of a second set of functional gate structures. For example, the gate conductor portion of a first set of functional gate structure may comprise an nFET gate metal, while the gate conductor portion of a second set of functional gate structure may comprise a pFET gate metal.

The gate conductor material used in providing the gate conductor portion 42 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for gate conductor portions of different functional gate structures, block mask technology can be used. In one embodiment, the gate conductor material used in providing the gate conductor portion 42 has a thickness from 1 nm to 100 nm. Other thicknesses that are lesser than, or greater than, the aforementioned thickness range can also be employed for the gate conductor material used in providing the gate conductor portion 42.

If present, the gate cap portion of the functional gate structure comprises a gate cap material. The gate cap material that provides the gate cap portion may include a hard mask material such as, for example, silicon dioxide, silicon nitride, and/or silicon oxynitride. The hard mask material that provides the gate cap portion can be formed utilizing a conventional deposition process such as, for example, chemical vapor deposition or plasma enhanced chemical vapor deposition. The material that provides the gate cap portion can have a thickness from 5 nm to 20 nm. Other thicknesses that are lesser than, or greater than, the aforementioned thickness range can also be employed as the thickness of the material that provides the gate cap portion.

The functional gate structure can be formed by providing a functional gate material stack of, from bottom to top, the gate dielectric material, the gate conductor material and, if present, the gate cap material. The gate material stack can then planarized to provide the functional gate structure shown in FIGS. 16A and 16B of the present application.

Notably, FIGS. 16A and 16B illustrate exemplary semiconductor structures in accordance with the present application. Each semiconductor structure may include a functional gate structure (40, 42) straddling over a portion of a semiconductor fin 12. A gate spacer 44 (composed of remaining portion of a lower hard mask layer, such as a nitride) is located on each vertical sidewall surface of the functional gate structure (40, 42). An epitaxial doped semiconductor material 36 is located on other portions of the semiconductor fin 12 and both sides of the functional gate structure (40, 42). A flowable dielectric material structure 38 is located on the epitaxial doped semiconductor material 36 and having a first sidewall surface contacting a sidewall surface of the gate spacer 44. In accordance with the present application, sidewall surfaces of the flowable dielectric material structure 38 are vertically coincident to sidewall surfaces of the epitaxial doped semiconductor material 36. The structure further includes an outer spacer 46 (composed of another remaining portion of a lower hard mask layer, e.g., a nitride) contacting a second sidewall surface of the flowable dielectric material structure 38, wherein the second sidewall surface is opposite the first sidewall surface.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
    forming a pair of spaced apart mandrel structures on a surface of an upper hard mask layer, said upper hard mask layer is located on a lower hard mask layer that is located above and surrounding a portion of a semiconductor fin, wherein a spacer is present on each sidewall surface of each mandrel structure, said forming said pair of mandrel structures comprises forming said lower hard mask layer, forming said upper hard mask layer on said lower hard mask layer, forming a layer of mandrel material, and patterning said layer of mandrel material;
    etching said upper and lower hard mask layers utilizing each mandrel structure and said spacers an etch mask;
    removing each mandrel structure to provide a pair of source/drain openings;
    extending a length of each source/drain opening by etching through remaining portions of said upper hard mask layer and said lower hard mask layer to provide a pair of spaced apart upper hard mask spacer portions and a pair of lower hard mask spacer portions and to provide an extended length source/drain opening that exposes a surface of said semiconductor fin;
    forming a doped epitaxial semiconductor material on said semiconductor fin and within each extended length source/drain opening;
    forming a flowable dielectric material structure in a lower portion of each extended length source/drain opening and atop the epitaxial doped semiconductor material, said flowable dielectric material structure having a topmost surface that is coplanar with a topmost surface of each lower hard mask spacer portion; and
    forming a functional gate structure contacting a sidewall surface of each lower hard mask spacer portion.

2. The method of claim 1, wherein said semiconductor fin is formed by patterning an upper semiconductor material portion of a semiconductor substrate.

3. The method of claim 2, wherein after said patterning a local isolation structure is formed at a footprint of said semiconductor fin.

4. The method of claim 1, wherein said patterning said layer of mandrel material comprises:

forming a layer of hard mask material on said layer of mandrel material;
forming an optical planarization layer (OPL) on said layer of hard mask material;
forming an anti-reflective coating (ARC) on said OPL;
forming a photoresist material on said ARC;
patterning said photoresist material to provide a pair of spaced apart photoresist structures; and
etching through said ARC, said OPL, said layer of hard mask material and said layer of mandrel material utilizing said pair of spaced apart photoresist structures as an etch mask.

5. The method of claim 1, wherein said spacers are formed by deposition of a spacer material and etching said spacer material.

6. The method of claim 1, wherein said etching said upper and lower hard mask layers comprises at least one anisotropic etching process.

7. The method of claim 1, further comprising forming a sacrificial material on sidewall surfaces of said spacers and said remaining portions of said upper and lower hard mask layers, said forming said sacrificial material is performed after said etching said upper and lower hard mask layers utilizing each mandrel structure and said spacers an etch mask and prior to said removing each mandrel structure.

8. The method of claim 7, wherein said sacrificial material is removed after said forming said flowable dielectric material structure and prior to said forming said functional gate structure.

9. The method of claim 1, wherein said forming said doped epitaxial semiconductor material comprises an epitaxial growth process.

10. The method of claim 1, wherein said forming said flowable dielectric material structure comprises:
forming a flowable dielectric material; and
planarizing said flowable dielectric material.

11. The method of claim 10, wherein said planarizing removes each upper hard mask spacer portion from atop each lower hard mask spacer portion.

12. The method of claim 1, wherein said spacers are removed after said etching through remaining portions of said upper hard mask layer and said lower hard mask layer, and prior to said forming said flowable dielectric material structure.

13. A method of forming a semiconductor structure, said method comprising:
forming a pair of spaced apart mandrel structures on a surface of an upper hard mask layer, said upper hard mask layer is located on a lower hard mask layer that is located above and surrounding a portion of a semiconductor fin, wherein a spacer is present on each sidewall surface of each mandrel structure;
etching said upper and lower hard mask layers utilizing each mandrel structure and said spacers an etch mask;
removing each mandrel structure to provide a pair of source/drain openings;
extending a length of each source/drain opening by etching through remaining portions of said upper hard mask layer and said lower hard mask layer to provide a pair of spaced apart upper hard mask spacer portions and a pair of lower hard mask spacer portions and to provide an extended length source/drain opening that exposes a surface of said semiconductor fin;
forming a doped epitaxial semiconductor material on said semiconductor fin and within each extended length source/drain opening;
forming a flowable dielectric material structure in a lower portion of each extended length source/drain opening and atop the epitaxial doped semiconductor material, said flowable dielectric material structure having a topmost surface that is coplanar with a topmost surface of each lower hard mask spacer portion;
forming a functional gate structure contacting a sidewall surface of each lower hard mask spacer portion; and
forming a sacrificial material on sidewall surfaces of said spacers and said remaining portions of said upper and lower hard mask layers, said forming said sacrificial material is performed after said etching said upper and lower hard mask layers utilizing each mandrel structure and said spacers an etch mask and prior to said removing each mandrel structure.

14. A method of forming a semiconductor structure, said method comprising:
forming a pair of spaced apart mandrel structures on a surface of an upper hard mask layer, said upper hard mask layer is located on a lower hard mask layer that is located above and surrounding a portion of a semiconductor fin, wherein a spacer is present on each sidewall surface of each mandrel structure;
etching said upper and lower hard mask layers utilizing each mandrel structure and said spacers an etch mask;
removing each mandrel structure to provide a pair of source/drain openings;
extending a length of each source/drain opening by etching through remaining portions of said upper hard mask layer and said lower hard mask layer to provide a pair of spaced apart upper hard mask spacer portions and a pair of lower hard mask spacer portions and to provide an extended length source/drain opening that exposes a surface of said semiconductor fin;
forming a doped epitaxial semiconductor material on said semiconductor fin and within each extended length source/drain opening;
forming a flowable dielectric material structure in a lower portion of each extended length source/drain opening and atop the epitaxial doped semiconductor material, said flowable dielectric material structure having a topmost surface that is coplanar with a topmost surface of each lower hard mask spacer portion; and
forming a functional gate structure contacting a sidewall surface of each lower hard mask spacer portion, wherein said spacers are removed after said etching through remaining portions of said upper hard mask layer and said lower hard mask layer, and prior to said forming said flowable dielectric material structure.

\* \* \* \* \*